United States Patent
Sharan et al.

(10) Patent No.: US 6,335,282 B1
(45) Date of Patent: Jan. 1, 2002

(54) METHOD OF FORMING A TITANIUM COMPRISING LAYER AND METHOD OF FORMING A CONDUCTIVE SILICIDE CONTACT

(75) Inventors: Sujit Sharan; Gurtej S. Sandhu, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/383,888

(22) Filed: Aug. 26, 1999

(51) Int. Cl.⁷ .............................................. H01L 21/44
(52) U.S. Cl. ...................... 438/682; 438/683; 438/681
(58) Field of Search ................................. 438/680–685, 438/656, 672, 534, 627, 630

(56) References Cited

U.S. PATENT DOCUMENTS

| | | | |
|---|---|---|---|
| 5,173,327 A | * 12/1992 | Sandhu et al. | 438/680 |
| 5,232,871 A | 8/1993 | Ho | 437/190 |
| 5,278,100 A | * 1/1994 | Doan et al. | 438/681 |
| 5,567,483 A | 10/1996 | Foster et al. | 427/535 |
| 5,595,784 A | * 1/1997 | Kaim et al. | 427/255.2 |
| 5,665,640 A | * 9/1997 | Foster et al. | 438/680 |
| 5,747,116 A | * 5/1998 | Sharan et al. | 427/534 |
| 5,773,363 A | * 6/1998 | Dederian et al. | 438/672 |
| 5,834,371 A | * 11/1998 | Ameen et al. | 438/656 |
| 5,906,866 A | * 5/1999 | Webb | 427/534 |
| 5,926,737 A | * 7/1999 | Ameen et al. | 438/649 |
| 5,950,108 A | * 9/1999 | Wu et al. | 438/685 |
| 5,956,616 A | * 9/1999 | Mizuno et al. | 438/680 |
| 5,973,402 A | * 10/1999 | Shinriki et al. | 257/768 |
| 6,001,736 A | * 12/1999 | Kondo et al. | 438/650 |
| 6,051,281 A | * 4/2000 | Kobayashi et al. | 427/253 |

FOREIGN PATENT DOCUMENTS

| | | | |
|---|---|---|---|
| JP | 07297136 A | * 11/1995 | H01L/21/205 |
| JP | 08279558 A | * 10/1996 | H01L/21/768 |
| JP | 10226598 A | * 8/1998 | C30B/29/16 |

* cited by examiner

*Primary Examiner*—Charles Bowers
*Assistant Examiner*—Brook Kebede
(74) *Attorney, Agent, or Firm*—Wells, St. John, Roberts, Gregory & Matkin P.S.

(57) ABSTRACT

The invention includes methods of forming titanium comprising layers, and methods of forming conductive silicide contacts. In one implementation, a method of forming a titanium comprising layer includes chemical vapor depositing a layer a majority of which comprises elemental titanium, titanium silicide or a mixture thereof over a substrate using a precursor gas chemistry comprising titanium and chlorine. The layer comprises chlorine from the precursor gas chemistry. The layer is exposed to a hydrogen containing plasma effective to drive chlorine from the layer. In one implementation, a method of forming a conductive silicide contact includes forming an insulating material over a silicon comprising substrate. An opening is formed into the insulating material over a node location on the silicon comprising substrate to which electrical connection is desired. A layer is chemical vapor deposited over the substrate using a precursor gas chemistry comprising titanium and chlorine. The layer comprises chlorine from the precursor gas chemistry. The depositing forms a majority of the layer over the node location as titanium silicide, and a majority of the layer over the insulating material as elemental titanium. At least the majority titanium silicide portion of the layer is exposed to a hydrogen containing plasma effective to drive chlorine therefrom.

47 Claims, 3 Drawing Sheets

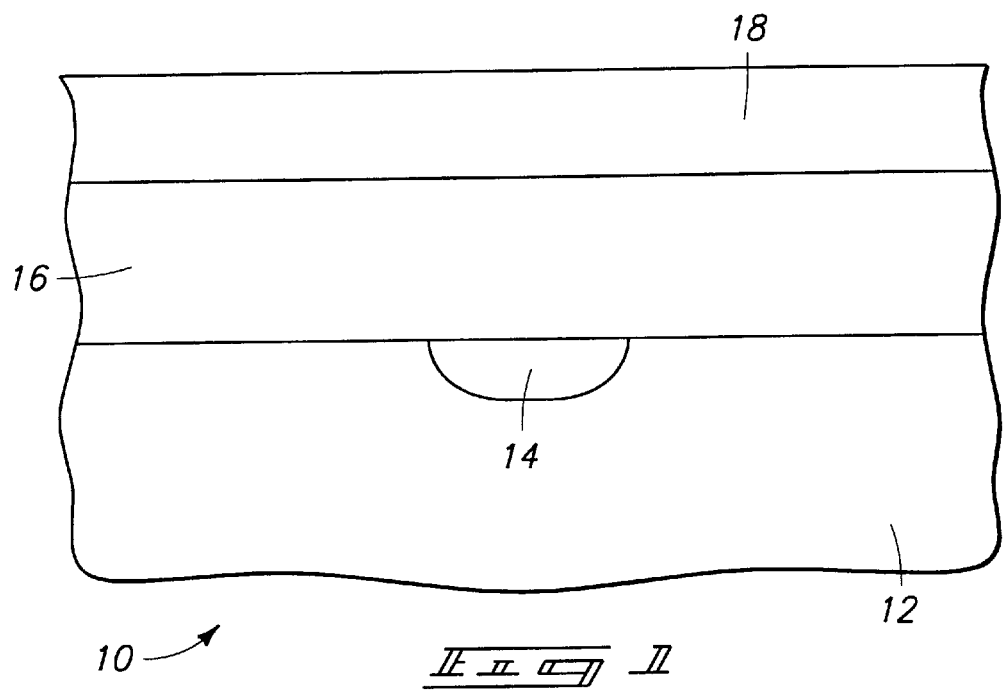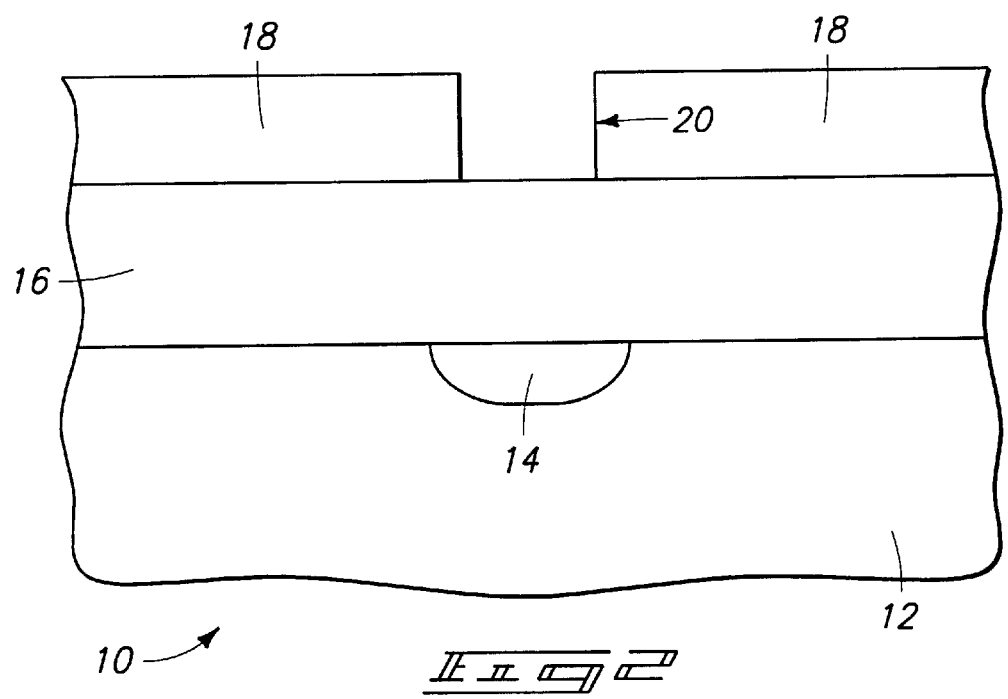

METHOD OF FORMING A TITANIUM COMPRISING LAYER AND METHOD OF FORMING A CONDUCTIVE SILICIDE CONTACT

TECHNICAL FIELD

This invention relates to methods of forming titanium comprising layers, and to methods of forming conductive silicide contacts.

BACKGROUND OF THE INVENTION

In the processing of integrated circuits, electrical contact is typically made to isolated active device regions formed within a wafer substrate typically comprising monocrystalline silicon. The active regions are typically connected by highly electrically conductive paths or lines which are fabricated above an insulating material formed over the substrate surface. Further, electrical contact is also typically made to other conductive regions received outwardly of the bulk wafer, such as to conductive lines, contact plugs and other devices. To provide electrical connection between two conductive regions, an opening in an insulating layer is typically etched to the desired regions to enable subsequently formed conductive films to connect with such regions. Where the desired region comprises silicon, conductance can be greatly enhanced by forming a conductive metal silicide interface with the silicon region.

Silicide layers might be formed in a number of manners. For example, a metal layer such as titanium might be deposited onto a silicon comprising substrate, and subsequently subjected to a high temperature anneal sufficient to react the titanium with the silicon to form titanium silicide. Alternately, the deposition conditions for depositing an otherwise elemental titanium layer might be sufficient to cause reaction during the deposition between the titanium and underlying silicon to form the silicide. Even further alternately and by way of example only, a titanium silicide might be directly chemical vapor deposited onto a substrate.

Regardless, $TiCl_4$ is one example prior art preferred precursor gas for chemical vapor depositing titanium, titanium silicide or a mixture thereof, with or without plasma. Chlorine atoms from the $TiCl_4$ can undesirably be incorporated into the elemental titanium and/or titanium silicide layer being formed over a substrate. Further, chemical vapor deposited titanium and titanium silicide films are susceptible to incorporating oxygen from room ambient. This can potentially form occluding insulative oxide layers at worse, or result in interstitial oxygen atom incorporation which reduces conductance at best. Further, chlorine incorporation can lead to poor addition of the film to substrates as well as excessive oxidation when exposed to oxygen or moisture in the ambient.

One prior art technique for preventing oxygen incorporation is to passivate the deposited titanium and/or titanium silicide layer with a nitrogen atmosphere, such as using plasma or with higher pressure nitrogen atmosphere exposure. Such can result in forming an outer region of such layers which is higher in nitrogen concentration than lower regions, perhaps forming TiN which is a conductive barrier layer substantially impermeable to oxygen or subsequent oxidation at typical ambient conditions. However passivation with a nitrogen containing atmosphere undesirably has the adverse effect of increasing ultimate chlorine content of the titanium and/or titanium silicide film, as well as increasing the tensile stress of the film. Such is believed to be due to formation of a barrier portion at the top of the layer which prevents conventional inherent driving of chlorine from such layer in later processing steps. Further, the resultant higher chlorine concentration inherently leads to increased tensile stress in the film. These adverse effects are deleterious to film performance in terms of adhesion and peeling and may also have issues with long term reliability of the deposited film.

While the invention was principally motivated and resulted from achieving solutions to the above-identified problems, the invention is not so limited, with the scope being defined by the accompanying claims as literally worded and interpreted in accordance with the doctrine of equivalence.

SUMMARY

The invention comprises methods of forming titanium comprising layers, and methods of forming conductive silicide contacts. In one implementation, a method of forming a titanium comprising layer includes chemical vapor depositing a layer a majority of which comprises elemental titanium, titanium silicide or a mixture thereof over a substrate using a precursor gas chemistry comprising titanium and chlorine. The layer comprises chlorine from the precursor gas chemistry. The layer is exposed to a hydrogen containing plasma effective to drive chlorine from the layer. In one implementation, a method of forming a conductive silicide contact includes forming an insulating material over a silicon comprising substrate. An opening is formed into the insulating material over a node location on the silicon comprising substrate to which electrical connection is desired. A layer is chemical vapor deposited over the substrate using a precursor gas chemistry comprising titanium and chlorine. The layer comprises chlorine from the precursor gas chemistry. The depositing forms a majority of the layer over the node location as titanium silicide, and a majority of the layer over the insulating material as elemental titanium. At least the majority titanium silicide portion of the layer is exposed to a hydrogen containing plasma effective to drive chlorine therefrom.

BRIEF DESCRIPTION OF THE DRAWINGS

Preferred embodiments of the invention are described below with reference to the following accompanying drawings.

FIG. 1 is a diagrammatic fragmentary view of a semiconductor wafer fragment at one processing step in accordance with the invention.

FIG. 2 is a view of the FIG. 1 wafer at a processing step subsequent to that shown by FIG. 1.

DETAILED DESCRIPTION OF THE PREFERRED EMBODIMENTS

Figure 3:
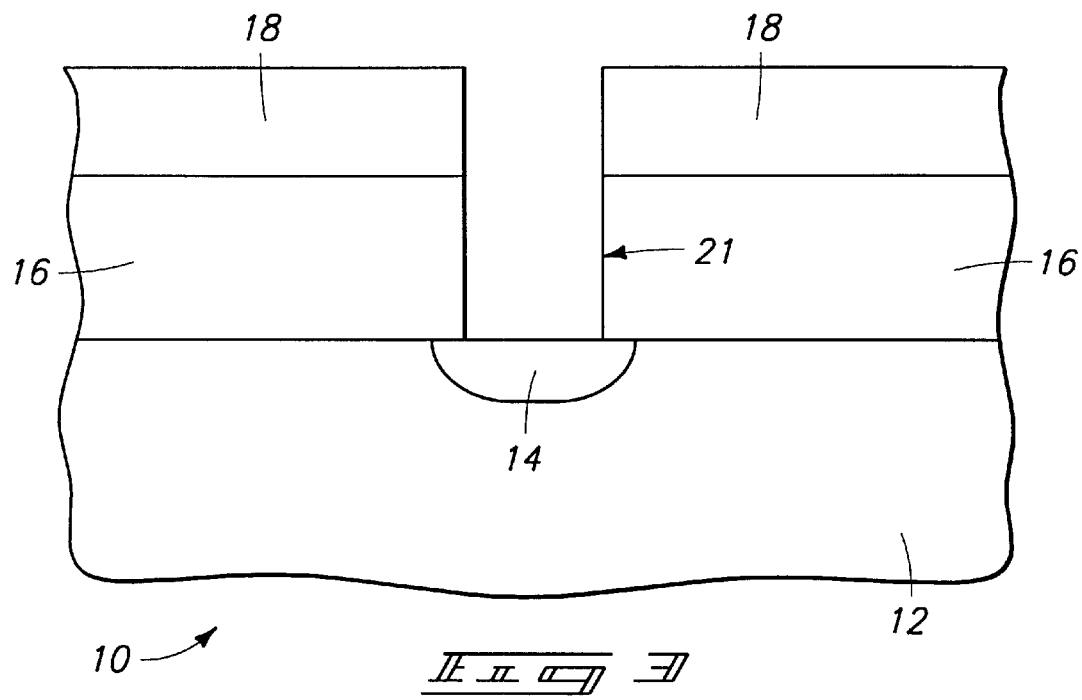
FIG. 3 is a view of the FIG. 1 wafer at a processing step subsequent to that shown by FIG. 2.

This disclosure of the invention is submitted in furtherance of the constitutional purposes of the U.S. Patent Laws "to promote the progress of science and useful arts" (Article 1, Section 8).

Referring to FIG. 1, a semiconductor wafer fragment is indicated generally with reference numeral 10. Such comprises a bulk monocrystalline silicon semiconductor substrate 12 having an exemplary conductive diffusion region 14 formed therein. In the context of this document, the term "semiconductor substrate" or "semiconductive substrate" is defined to mean any construction comprising semiconductive material, including, but not limited to, bulk semiconductive material such as a semiconductive wafer (either alone or in assemblies comprising other materials thereon), and semiconductor material layers (either alone or in assemblies comprising other materials). The term "substrate" refers to any supporting structure, including, but not limited to, the semiconductor substrate describes above. Further in the context of this document, "silicon comprising substrate" is intended to mean a substrate comprising monocrystalline silicon material, polycrystalline silicon material, and/or silicon compound materials. Diffusion region 14 constitutes but one example of a node location on a silicon comprising substrate to which electrical connection is desired.

An electrically insulating layer 16, such as borophosphosilicate glass (BPSG), is formed over substrate 12. A masking layer 18 is formed thereover. An example and preferred material for layer 18 is photoresist, whereby photolithography will be utilized to pattern a contact opening to node location/diffusion region 14.

Referring to FIG. 2, masking layer 18 is patterned to form openings therein (preferably therethrough), such as illustrated opening 20 over diffusion region 14.

Referring to FIG. 3, an opening 21 is formed into insulating material 16 over node location 14 through photoresist opening 20, and preferably completely through insulating layer 16 as shown. Such etching preferably is a dry anisotropic etch, with or without plasma, and is conducted substantially selective relative to layer 16 and region 14. An example dry etching gas chemistry would include carbon and halogen components, with $CF_4$ being but one example. Wet or other etching could be conducted.

Figure 4:
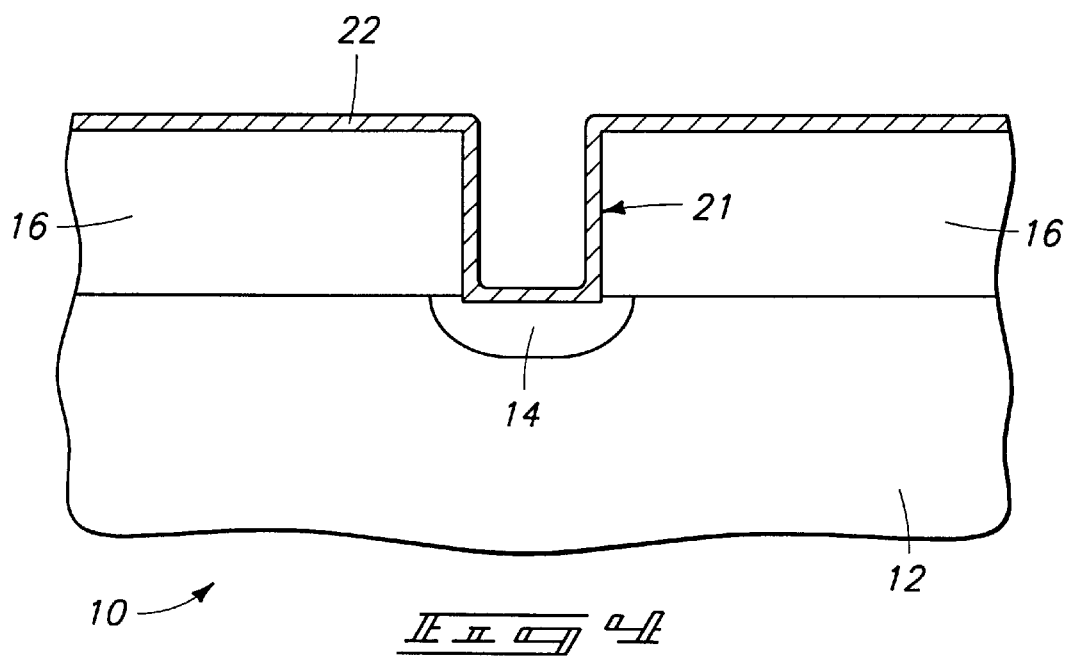
FIG. 4 is a view of the FIG. 1 wafer at a processing step subsequent to that shown by FIG. 3.

Referring to FIG. 4, photoresist layer 18 has been removed and a layer 22 chemical vapor deposited over exposed insulative regions 16 and silicon region 14, and accordingly over substrate 10. Such layer has a majority which comprises elemental titanium, titanium silicide or a mixture thereof, and is deposited using a precursor gas chemistry comprising titanium and chlorine. In the context of this document, "majority" also includes a layer which is composed entirely of the stated material(s). The preferred gas chemistry is inorganic, where the titanium and chlorine precursor gas chemistry includes at least one compound having both titanium and chlorine therein, such as $TiCl_4$. Layer 22 preferably consists essentially of elemental titanium, titanium silicide or a mixture thereof. The layer will also comprise chlorine from the precursor gas chemistry. FIG. 4 depicts chemical vapor deposition of layer 22 whereby the deposition consists essentially of a continuous or monolayer of elemental titanium. Accordingly, a majority thereof comprises elemental titanium.

Figure 5:
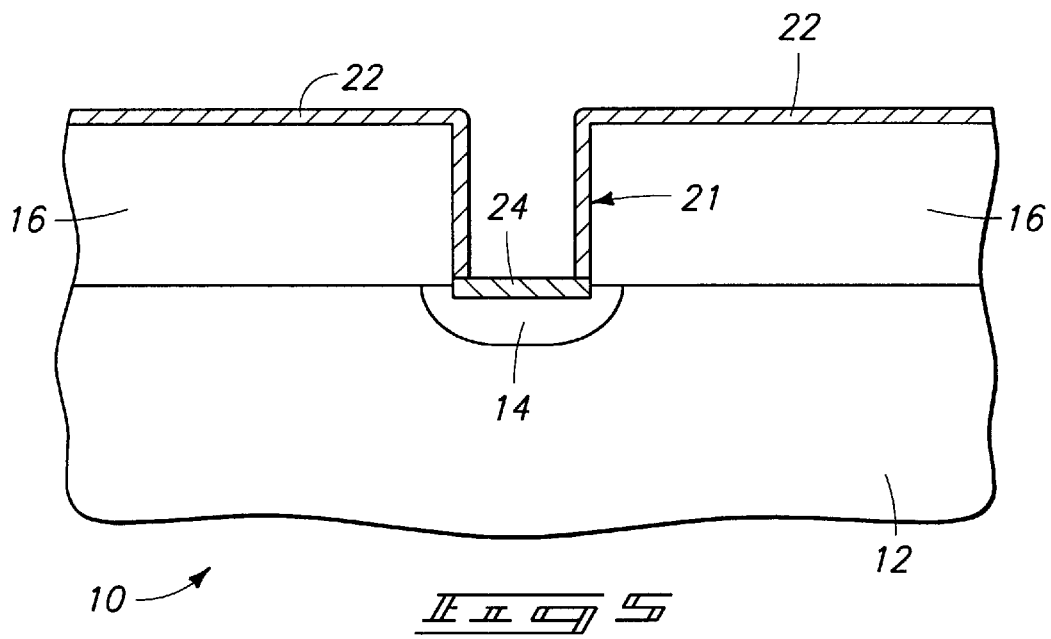
FIG. 5 is a view of the FIG. 1 wafer at a processing step subsequent to that shown by FIG. 4.

FIG. 5 illustrates alternate and preferred processing whereby region 22 of the chemical vapor deposited layer consists essentially of titanium formed over insulating material 16 and consists essentially of titanium silicide region 24 over silicon node location 14. Such would preferably occur during the deposition. Alternately, a deposition technique to produce the FIG. 4 construction could be subjected to a suitable subsequent high temperature anneal to cause a salicidation reaction to form region 24. Regardless, the precursor gas chemistry utilized to form layer 22/24 during deposition is preferably essentially void of nitrogen to preclude appreciable formation of TiN.

A preferred process for chemical vapor depositing layer 22/24 whereby predominately elemental titanium forms over insulating surfaces and titanium silicide forms over silicon surfaces includes precursor gases of $TiCl_4$, $H_2$ and Ar, at exemplary respective flow rates of 300 sccm, 5000 sccm and 5000 sccm. Wafer temperature is preferably maintained at about 650° C., reactor pressure at approximately 5 Torr, and RF power of 500 watts in a parallel plate capacitively coupled reactor for about 60 seconds.

The above provides examples of forming a layer a majority of which comprises elemental titanium, titanium silicide or a mixture thereof over a substrate, here in the form of desired silicide formation relative to a contact opening. Alternately of course, such a layer might be formed independent of contact opening formation in an insulating layer.

After the chemical vapor deposition, at least the majority titanium silicide portion 24 of layer 22/24 is exposed to a hydrogen containing plasma effective to drive chlorine therefrom. The hydrogen containing plasma is preferably derived at least in part from one or both of $H_2$ and $NH_3$. Exemplary preferred conditions for the exposure include a pressure from about 0.5 Torr to about 2.0 Torr, wafer temperature at from about 500° C. to 750° C., power at from about 100 watts to 1000 watts, and a treatment time of from about 1 to about 60 seconds. An inert gas such as Ar is preferably combined with the hydrogen component of the gas in a flow rate equal to the hydrogen gas flow rate. For example, the preferred flow rate for the hydrogen component of the gas is from about 500 sccm to about 3000 sccm with the same flow rate for Ar. A flow rate of 1000 sccm is a specific example, at a pressure of 5 Torr, wafer temperature of 650° C. for 10 seconds at 500 watts in a capacitively coupled parallel plate plasma reactor.

Preferably after exposing the layer to a hydrogen containing plasma effective to drive chlorine therefrom, the layer is further exposed to a nitrogen containing atmosphere effective to form an outermost region of the layer which is enriched in nitrogen. In one implementation, the nitrogen containing atmosphere comprises plasma. By way of example only, such preferred processing would comprise a pressure of from about 0.5 Torr to about 20 Torr, a preferred wafer temperature range of about 500° C. to about 750° C., a power range of from about 100 watts to about 1000 watts for from about 1 to 30 seconds, flow rates in one example would be from about 500 sccm to about 3000 sccm of $N_2$ and the same quantity of Ar. $H_2$ or $NH_3$ might also be utilized.

In another implementation, plasma might not be utilized. For example, the same above processing parameters could be utilized except with no reactor power and providing reactor pressure at from about 20 Torr to about 100 Torr and, for example, a $N_2$ flow in the absence of plasma to achieve suitable nitrogen incorporation. The incorporated nitrogen might form TiN of the outer layer, or merely enriching an outer portion of the layer in nitrogen which advantageously and preferably provides a passivating effect to the outer layer 22/24 to avoid further oxygen incorporation or oxidation.

Figure 6:
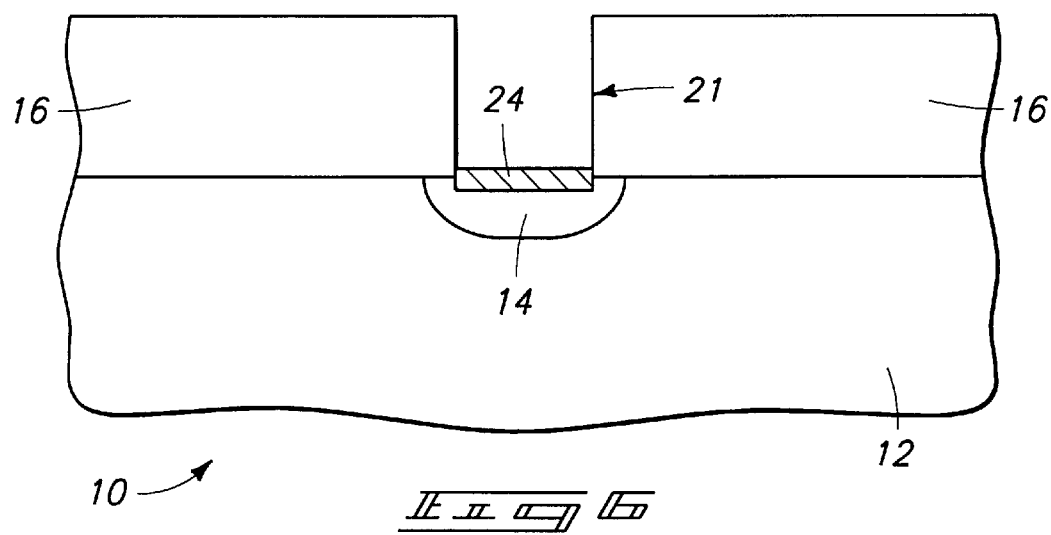
FIG. 6 is a view of the FIG. 1 wafer at a processing step subsequent to that shown by FIG. 5.

Referring to FIG. 6, unreacted majority elemental titanium layer 22 has been removed leaving silicide contact 24 at the base of the contact opening. Such elemental titanium might be removed from the substrate prior to the exposing to the hydrogen and/or nitrogen containing atmosphere.

In accordance with the most preferred implementations where a nitrogen atmosphere treatment occurs, driving of chlorine from the layer with a hydrogen containing plasma prior to nitrogen treatment can advantageously effectively reduce overall chlorine concentration.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a titanium comprising layer, comprising:
    chemical vapor depositing a layer a majority of which comprises elemental titanium, titanium silicide or a mixture thereof over a substrate using a precursor gas chemistry comprising titanium and chlorine, the layer comprising chlorine from the precursor gas chemistry;
    after the depositing, exposing the layer to a hydrogen containing plasma effective to drive chlorine from the layer; and
    after exposing the layer to a hydrogen containing plasma effective to drive chlorine therefrom, exposing the layer to a nitrogen containing atmosphere effective to form an outermost region of the layer which is enriched in nitrogen from what it was prior to the nitrogen containing atmosphere exposing.

2. The method of claim 1 wherein the gas chemistry is inorganic.

3. The method of claim 1 wherein the gas chemistry comprises $TiCl_4$.

4. The method of claim 1 wherein the layer consists essentially of elemental titanium, titanium silicide or a mixture thereof.

5. The method of claim 1 wherein the majority of the layer exposed comprises elemental titanium.

6. The method of claim 1 wherein the majority of the layer exposed comprises titanium silicide.

7. The method of claim 1 wherein the substrate comprises exposed insulative regions and exposed silicon containing regions, the depositing forming the layer to comprise titanium silicide in majority over the silicon containing regions and to comprise elemental titanium in majority over the insulative regions.

8. The method of claim 7 comprising removing the elemental titanium from the substrate prior to the exposing.

9. The method of claim 1 wherein the hydrogen containing plasma is derived at least in part from $H_2$.

10. The method of claim 1 wherein the hydrogen containing plasma is derived at least in part from $NH_3$.

11. The method of claim 1 wherein the hydrogen containing plasma is derived at least in part from $NH_3$ and $H_2$.

12. The method of claim 1 wherein the gas chemistry is essentially void of nitrogen.

13. The method of claim 1 wherein the exposing is effective to form said outermost region to principally comprise TiN.

14. The method of claim, 1 wherein the exposing while effective to form said outermost region to be enriched in nitrogen is ineffective to form said outermost region to principally comprise TiN.

15. The method of claim 1 wherein the nitrogen containing atmosphere comprises plasma.

16. The method of claim 1 wherein the nitrogen containing atmosphere is void of plasma.

17. The method of claim 1 wherein the nitrogen containing atmosphere comprises $N_2$.

18. The method of claim 1 wherein the nitrogen containing atmosphere comprises $NH_3$.

19. The method of claim 1 wherein the nitrogen containing atmosphere comprises a pressure of less than about 100 Torr.

20. The method of claim 1 wherein the nitrogen containing atmosphere is void of plasma, and comprises a pressure of less than about 100 Torr.

21. The method of claim 1 wherein the nitrogen containing atmosphere comprises plasma, and comprises a pressure of less than about 20 Torr.

22. The method of claim 1 wherein the nitrogen containing atmosphere is void of plasma, comprises a pressure of less than about 100 Torr, and comprises $N_2$.

23. A method of forming a conductive silicide contact comprising:
    forming an insulating material over a silicon comprising substrate;
    forming an opening into the insulating material over a node location on the silicon comprising substrate to which electrical connection is desired;
    chemical vapor depositing a layer over the substrate using a precursor gas chemistry comprising titanium and chlorine, the layer comprising chlorine from the precursor gas chemistry, the depositing forming a majority of the layer over the node location as titanium silicide, the depositing forming a majority of the layer over the insulating material as elemental titanium;
    after the depositing, exposing at least the majority titanium silicide portion of the layer to a hydrogen containing plasma effective to drive chlorine therefrom; and
    after exposing the layer to a hydrogen containing plasma effective to drive chlorine therefrom, exposing the layer to a nitrogen containing atmosphere effective to form an outermost region of the layer which is enriched in nitrogen from what it was prior to the nitrogen containing atmosphere exposing.

24. The method of claim 23 wherein the gas chemistry is essentially void of nitrogen.

25. The method of claim 23 wherein the hydrogen containing plasma is derived at least in part from $H_2$.

26. The method of claim 23 wherein the hydrogen containing plasma is derived at least in part from $NH_3$.

27. The method of claim 23 wherein the hydrogen containing plasma is derived at least in part from $NH_3$ and $H_2$.

28. The method of claim 23 wherein the exposing is effective to form said outermost region to principally comprise TiN.

29. The method of claim 23 wherein the exposing while effective to form said outermost region to be enriched in nitrogen is ineffective to form said outermost region to principally comprise TiN.

30. The method of claim 23 wherein the nitrogen containing atmosphere comprises plasma.

31. The method of claim 23 wherein the nitrogen containing atmosphere is void of plasma.

32. The method of claim 23 wherein the nitrogen containing atmosphere comprises $N_2$.

33. The method of claim 23 wherein the nitrogen containing atmosphere comprises $NH_3$.

34. The method of claim 23 wherein the nitrogen containing atmosphere comprises a pressure of less than about 100 Torr.

35. The method of claim 23 wherein the nitrogen containing atmosphere is void of plasma, and comprises a pressure of less than about 100 Torr.

36. The method of claim 23 wherein the nitrogen containing atmosphere comprises plasma, and comprises a pressure of less than about 20 Torr.

37. The method of claim 23 wherein the nitrogen containing atmosphere is void of plasma, comprises a pressure of less than about 100 Torr, and comprises $N_2$.

38. A method of forming a titanium comprising layer, comprising:

chemical vapor depositing a layer a majority of which comprises elemental titanium, titanium silicide or a mixture thereof over a substrate using a precursor gas chemistry comprising titanium and chlorine, the layer comprising chlorine from the precursor gas chemistry, the gas chemistry being essentially void of nitrogen;

after the depositing, exposing the layer to a hydrogen containing plasma effective to drive chlorine from the layer, the hydrogen containing plasma being essentially void of nitrogen; and after exposing the layer to a hydrogen containing plasma effective to drive chlorine therefrom, exposing the layer to a nitrogen containing atmosphere effective to form an outermost region of the layer which is enriched in nitrogen from what it was prior to the nitrogen containing atmosphere exposing, the nitrogen containing atmosphere being essentially void of hydrogen.

39. The method of claim 38 wherein the exposing is effective to form said outermost region to principally comprise TiN.

40. The method of claim 38 wherein the exposing while effective to form said outermost region to be enriched in nitrogen is ineffective to form said outermost region to principally comprise TiN.

41. The method of claim 38 wherein the nitrogen containing atmosphere comprises plasma.

42. The method of claim 38 wherein the nitrogen containing atmosphere is void of plasma.

43. The method of claim 38 wherein the nitrogen containing atmosphere comprises $N_2$.

44. The method of claim 38 wherein the nitrogen containing atmosphere comprises a pressure of less than about 100 Torr.

45. The method of claim 38 wherein the nitrogen containing atmosphere is void of plasma, and comprises a pressure of less than about 100 Torr.

46. The method of claim 38 wherein the nitrogen containing atmosphere comprises plasma, and comprises a pressure of less than about 20 Torr.

47. The method of claim 38 wherein the nitrogen containing atmosphere is void of plasma, comprises a pressure of less than about 100 Torr, and comprises $N_2$.

* * * * *